United States Patent
Bencivenga et al.

[11] Patent Number: 5,901,045
[45] Date of Patent: * May 4, 1999

[54] METHOD AND APPARATUS FOR ISOLATING COMPONENT LEADS

[75] Inventors: Ernest Bencivenga, Hookset; Ronald P. Fotino, Rochester, both of N.H.

[73] Assignee: Cabletron Systems, Inc., Rochester, N.H.

[ * ] Notice: This patent issued on a continued prosecution application filed under 37 CFR 1.53(d), and is subject to the twenty year patent term provisions of 35 U.S.C. 154(a)(2).

[21] Appl. No.: 08/812,841

[22] Filed: Mar. 6, 1997

[51] Int. Cl.$^6$ ...................................................... H05K 7/02
[52] U.S. Cl. .................... 361/760; 361/642; 361/679; 337/222; 337/223; 337/224; 337/227; 337/228; 337/248; 337/186
[58] Field of Search ...................................... 361/642, 679, 361/760, 762, 770; 337/227, 228, 245, 246, 223, 224, 222, 248

[56] References Cited

U.S. PATENT DOCUMENTS

3,813,626  5/1974  Cetola et al. ............................ 337/245
4,460,887  7/1984  McAlear et al. ........................ 337/186
4,841,413  6/1989  Mizerak .................................. 361/760
4,926,290  5/1990  Mizerak .................................. 361/679

Primary Examiner—Leo P. Picard
Assistant Examiner—Boris L. Chervinsky
Attorney, Agent, or Firm—Wolf, Greenfield & Sacks, P.C.

[57] ABSTRACT

A device for isolating a hazardous connection on a circuit board includes an elongated enclosure having a bore extending therethrough and a slot extending longitudinally from a first end of the enclosure. A component such as a fuse, having leads on both ends, is advanced through the bore until one of the leads, bent orthogonally to the enclosure, becomes secured in a distal end (pocket) of the slot. The length of the enclosure is determined such that when the lead is engaged in the distal end of the slot, a portion of the enclosure extends over the lead to isolate any connections made by that lead from external contact. In a preferred embodiment, a second slot is provided on the other end of the enclosure wherein a second lead may then be bent orthogonally to the device, and parallel with the first lead, to isolate both leads of the component. The protective device is advantageously transparent to allow for monitoring of the component being isolated.

23 Claims, 6 Drawing Sheets

METHOD AND APPARATUS FOR ISOLATING COMPONENT LEADS

BACKGROUND OF THE INVENTION

1. Field of the Invention

This invention relates generally to the field of electrical connections and more specifically to the isolation of hazardous connections in circuit board designs.

2. Discussion of the Related Art

As known in the art, the interface between a power supply and a device on a circuit board must be protected to insure that the device does not draw more power than it is able to accommodate. Protection is usually provided by fuses, coupled between the device and the power supply. In the event the device becomes overpowered, the fuse disables the conduction path between the power supply and the device, thereby protecting the device against damage.

One drawback is that the connection between the fuse and the power supply presents a safety hazard. Contact with this connection results in an unprotected draw of power directly from the power supply. The draw of power may be substantial enough to cause injury to the contacting party or to damage a contacting device.

Contact can be prevented by requiring that circuit boards having fused connections be handled using a special tool, for example when inserting or removing the board from a computer system. Using a special tool minimizes potential hand contact of a user with the board, thereby minimizing the possibility of contact with the hazardous connection. A drawback of requiring a special tool is that it increases the time required for servicing the computer system as compared to manual insertion.

Two other devices that have been used to reduce contact with hazardous connections are heat shrink tubing and fuse holders. Heat shrink tubing is applied over the fuse and then heated, causing the tubing to tightly engage the fuse and a portion of the leads. However, this has several drawbacks. First, use of heat shrink tubing is a laborious process requiring a coverage and heating step for every fuse on the board. Second, the results are often imprecise, since the coverage of each fuse will vary with typical process variations. Third, because the heat shrink tubing is extended to cover a portion of the leads of the fuse, it is often difficult to bend the leads at the appropriate angles and locations as necessary to align the leads with their destination holes in the circuit board. If the leads do not properly align with the holes in the circuit board, the fuse may not sit flush on the board. If the fuse does not sit flush on the board, an unprotected portion of the fuse may still be exposed to the user.

The second device used to isolate a hazardous connection is a fuse holder. This is a large tube fixedly coupled to enclose the fuse body and a portion of the fuse leads. However, fuse holders are expensive and require a manufacturing step to fixedly couple the fuse to the holder. In addition, the fuse holder is typically larger than the fuse itself, and thus requires an increased area for mounting on the circuit board.

Thus, it would be desirable to develop an inexpensive and reliable device for protecting a user from the potential safety hazards of fuse connections.

SUMMARY OF THE INVENTION

According to one aspect of the invention, an apparatus for isolating a hazardous connection on a circuit board includes a protection device (enclosure) having an opening (bore) extending therethrough and a slot extending longitudinally from a first end of the protection device. The slot is for engaging a lead of a component, such as a fuse. The component is advanced through the opening of the device, such that the slotted portion of the protection device extends beyond the lead when the lead is secured in a distal end (pocket) of the slot. With such an arrangement, the hazardous lead is isolated from external contact by the slotted portion of the protection device.

In a particular embodiment, a fuse has a first lead for coupling to a power supply and a second lead for coupling to the component. The first fuse lead is positioned orthogonally to the protection device in a distal end of a first slot (extending from a first end of the device). The protection device further comprises a second slot extending from a second end of the device, and the second lead is positioned orthogonally in the second slot. With such an arrangement, a protection device capable of protecting two hazardous leads of a component is provided. Also, the leads may be aligned, using the device, to form a tight fit with the circuit board.

According to another aspect of the invention, a method of isolating a hazardous connection comprises the steps of: providing an elongated protection device having an opening extending longitudinally therethrough, and a slot extending longitudinally from one end of the protection device for a predetermined distance along the device; advancing a component through said opening until a lead of the component, positioned orthogonally to the protection device, engages a distal end (pocket) of the slot. With such an arrangement, the hazardous lead is isolated from external contact by the slotted portion of the protective device (between the distal end of the slot and the first end of the device). In a further method embodiment, the component further includes a second lead, positioned in a second slot, the second lead being bent along a distal end of the second slot to a position parallely aligned with the first lead. With such an arrangement, a method is provided for controlling the alignment of the leads of a component such that they are positioned in desired locations for tight engagement of the component with a circuit board.

The invention is further described with respect to the following detailed description and drawings, which are given by way of example only and are in no way restrictive.

DETAILED DESCRIPTION

Figure 1:
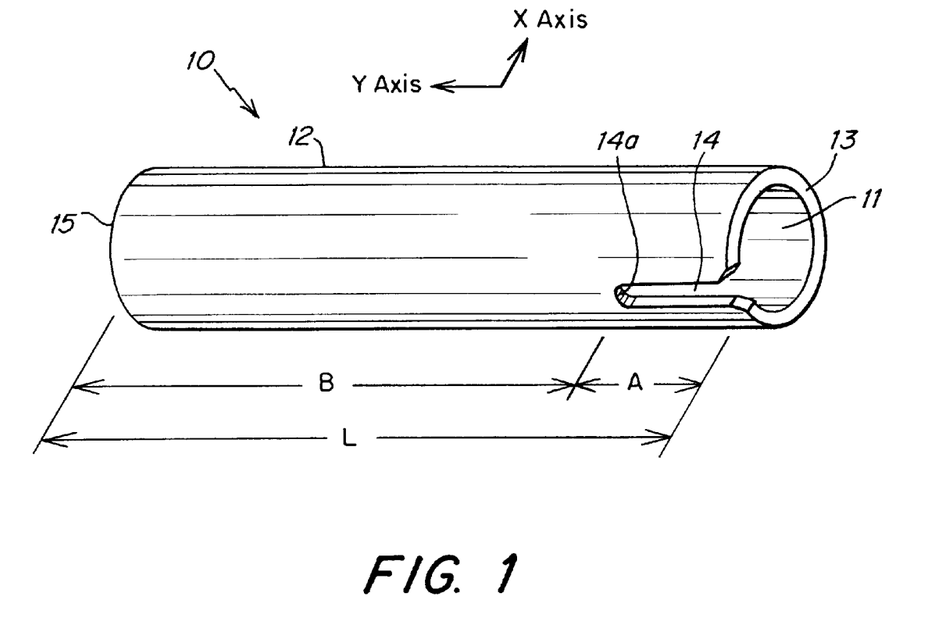
FIG. 1 is a top perspective view of one embodiment of a protection device according to the present invention.

Reference to the figures will now be made, where like numerals refer to like elements. In FIG. 1, a protection device 10 according to one embodiment of the invention is shown. The device is an elongated cylindrical tube 12 having a central bore (or opening) 11 extending throughout a length L of the tube, and having a slot 14, extending longitudinally from one end 13 of the tube 12 to a distal slot end (or pocket) 14a at a predetermined distance A from the one end 13. The remaining B length of the tube, from the lower end 14a of the slot to the other end 15 of the tube, is selected to accommodate a component body, such as a fuse body. As the component is inserted into the one end 13 of the tube and advanced first through the A length slot portion, and then through the remaining B length portion of the tube, a fuse lead may be secured in the pocket 14a of the slot 14, with the slot portion (A length) forming a protective cover for the lead as described hereinafter.

The protection device 10 provides a number of advantages over prior art isolation devices and methods. By securing a hazardous lead of a component at a distance A from the end of the protection device, the potential for contact with the hazardous connection may be substantially reduced or eliminated. In addition because the cylindrical tube has a defined shape, it may be reliably manufactured to exact specifications in bulk. In addition, because the B length of the cylinder is derived from the length of the component body that it protects, the protection device 10 requires only a minimal additional amount of circuit board space as compared to that required solely by the component body.

Figure 2A:
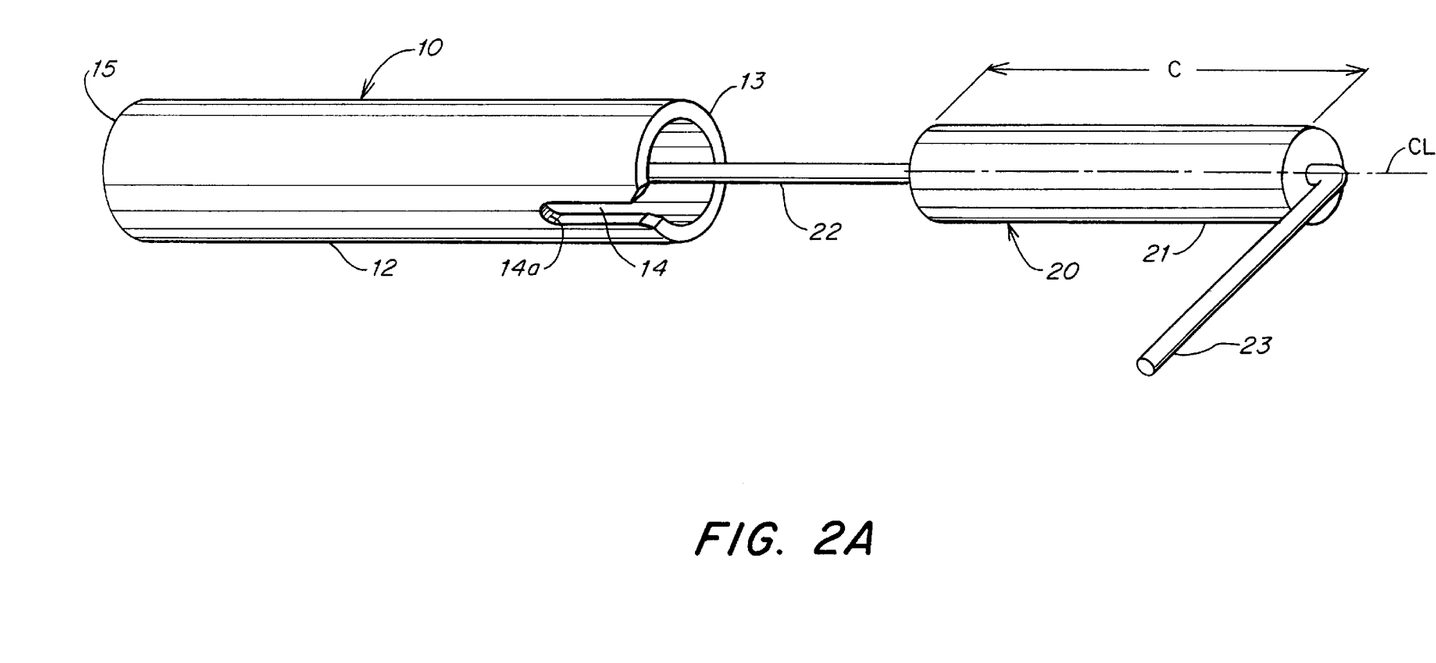
FIGS. 2A–2D are a series of perspective views illustrating the steps for engagement and use of the protection device of FIG. 1, with a fuse.
Figure 2B:
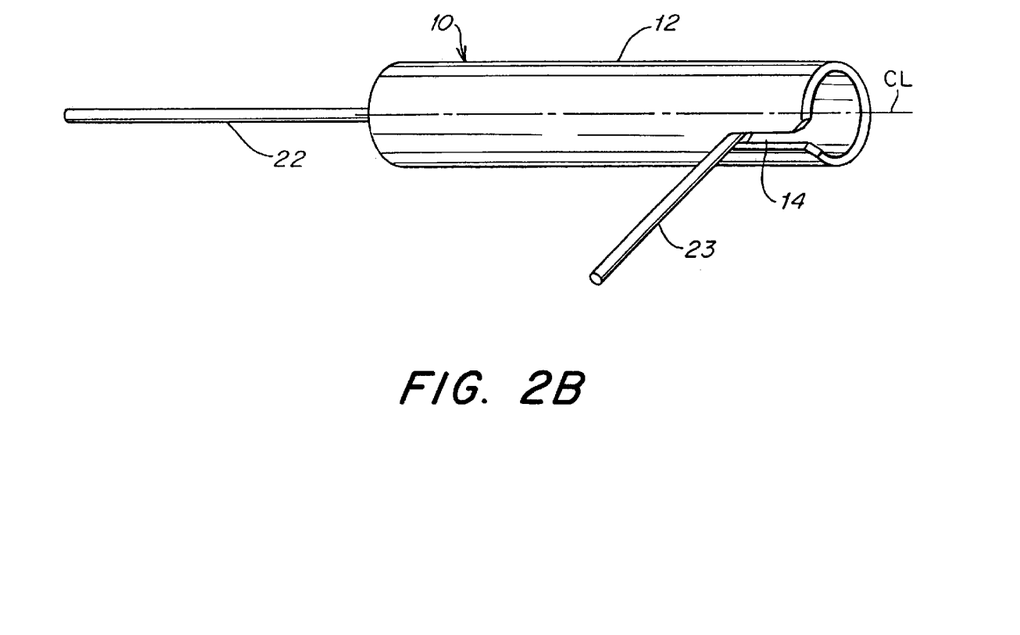
Figure 2C:
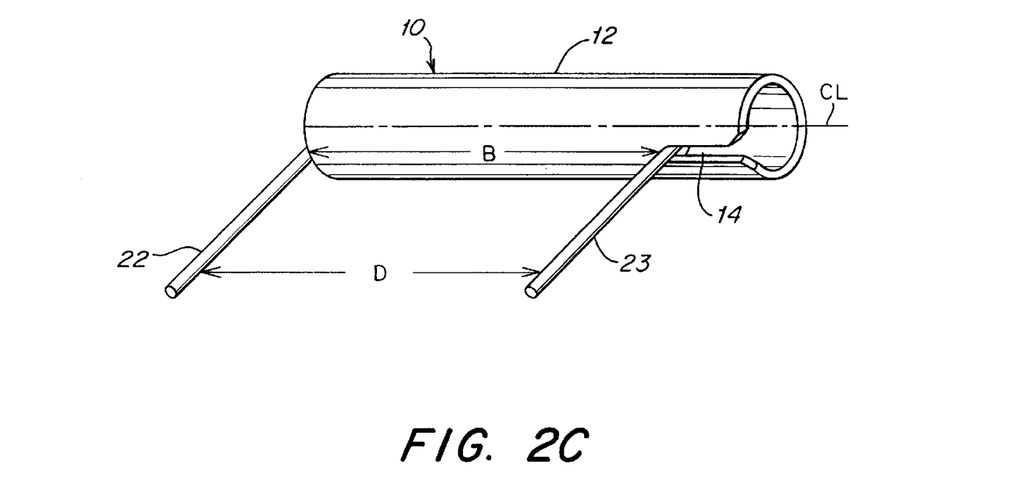

FIGS. 2A–2C illustrate use of the protection device to isolate a fuse coupled to a component on a circuit board. As known in the art, a fuse is often used to protect a component, mounted on the circuit board, from drawing too much power from a coupled power supply. In the event that the component draws too much power, the fuse disables the connection to the power supply and prevents damage to the circuit.

As described previously, the connection between the fuse and power supply is a hazardous area of the circuit board, since any contact made with this connection may result in an undesired draw of energy directly from the power supply source. The protection device 10 of the present invention eliminates the possibility of contact with that connection by shielding the hazardous area with a portion of the cylindrical tube 12.

Referring to FIG. 2A, a fuse 20 includes an elongated cylindrical fuse body 21, and two fuse leads 22 and 23, extending from opposing ends of the fuse body. Fuse lead 22 is to be coupled to a device on the circuit board (not shown). Fuse lead 23 is to be coupled to the power supply (not shown), and thus lead 23 will form the hazardous connection.

Before insertion of the fuse 20 into the protection device 10, fuse lead 23 is bent at approximately a 90° angle (to the cylindrical axis CL of the fuse body 21). The fuse 20 is inserted as shown through the cylindrical enclosure 12, by inserting fuse lead 22 into one end 13 of the tube 12, and advancing the fuse through the tube, with the bent lead 23 advancing into slot 14. Insertion of the fuse into the cylinder continues until the bent lead 23 makes secure contact with the pocket (distal end) 14a of the slot 14.

FIG. 2B shows the configuration of the fuse 20 after insertion into the cylindrical tube 12, with bent lead 23 fully advanced into the pocket 14a. Next, as shown in FIG. 2C, the lead 22 that extends out of the other end 15 of the tube, is also bent to approximately a 90° angle (with respect to the cylindrical axis of the fuse body and tube—now the same). As a result, the distance D between the bent leads 22 and 23 is approximately matched both to the length of the fuse body C and the B length of the tube 12, as well as to a connection length E on the circuit board that will receive the fuse (see FIG. 2D). Thus, the protective device itself provides a gauge for ensuring that the leads 22 and 23 may be bent at the correct location to ensure a tight fit between the circuit board and the fuse device. In addition, by matching the lengths of the circuit board connections E, the length of the remaining (unslotted) tube portion B, and the length of the fuse body C, it can be ensured that a minimum amount of additional board real-estate is required to accommodate the protection device 10.

Figure 2D:
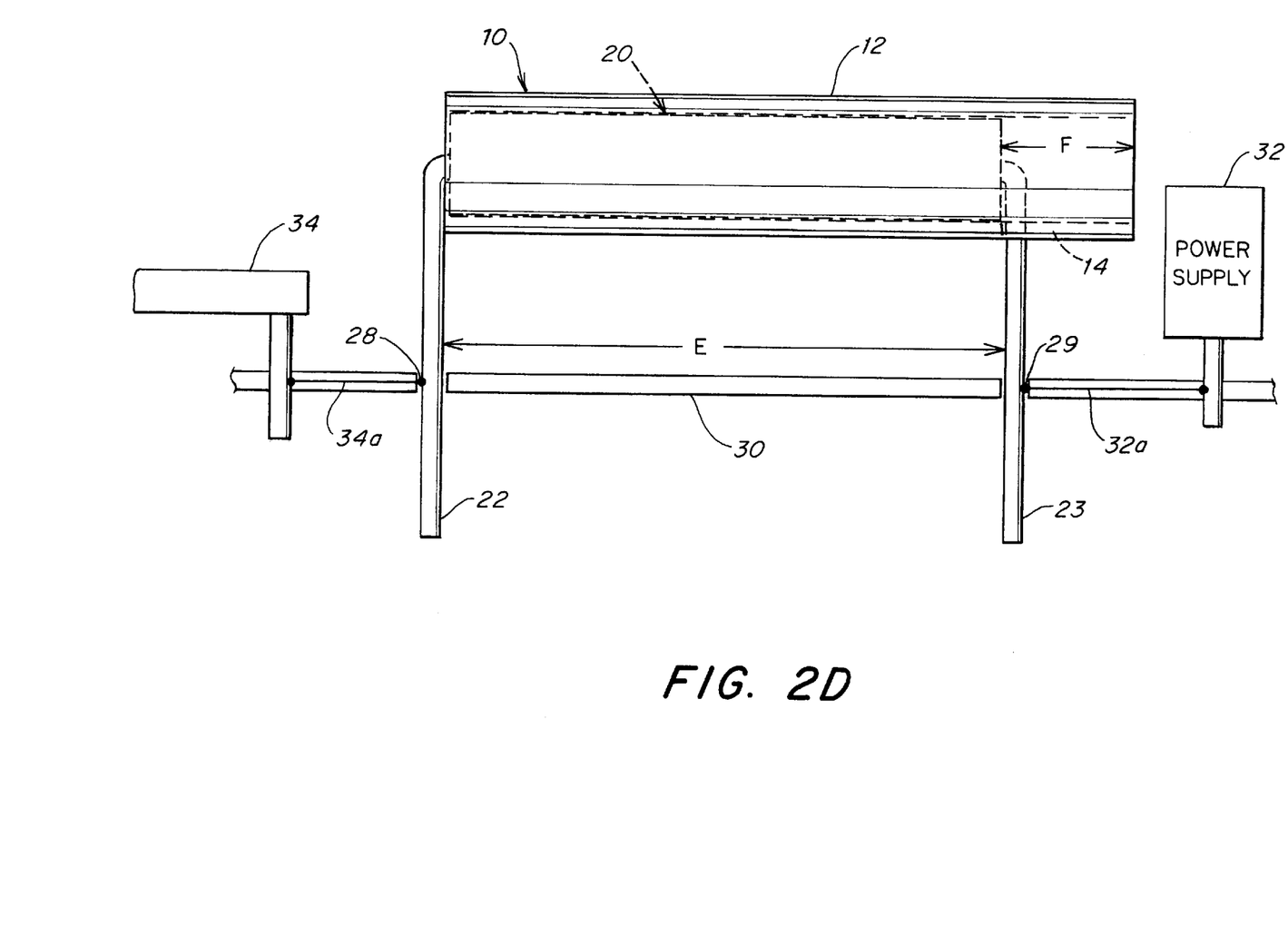

Referring now to FIG. 2D, the insertion of the fuse leads 23 and 22 into connections 28 and 29 on circuit board 30 is illustrated. The fuse 20 is located between power supply 32 and device 34 (on board 30). During manufacture, leads 23 and 22 will be respectively coupled to the power supply 32 and device 34 via respective conductive planes 32a and 34a of circuit board 30. Note that when the fuse is positioned on the board, a slotted portion F of cylinder 12 (associated with the length A of slot 14 and indicated by dashed lines) extends past the hazardous connection point between the fuse lead 23 and the connection 29. For example, the slot length in one embodiment, where a type 3AG fuse is being protected, is 0.315 inches. The slot length may be selected to satisfy standard finger probe tests, in order to bring the protection device into compliance with Underwriters Laboratory (UL) safety standards (i.e., the slot length is a length sufficient to prevent a finger from being able to come into contact with lead 23).

Figure 3:
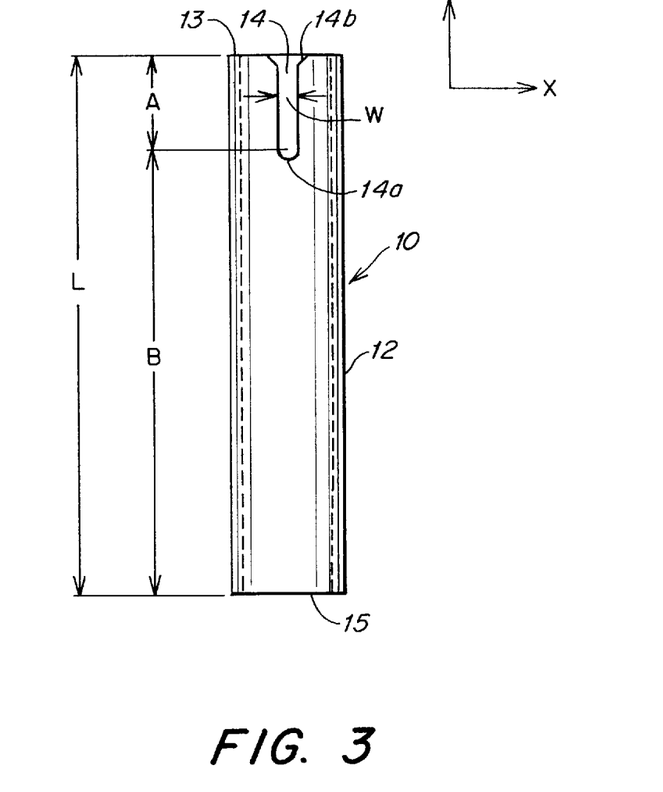
FIG. 3 is a cross section of the protection device of FIG. 1, taken along the Y axis.

Referring now to FIG. 3, an axial cross section of one particular embodiment of the cylindrical tube 12 is shown, taken along the Y axis. This particular tube embodiment includes dimensions for protection of a type 3AG fuse. The total length L of the cylindrical tube 12 is 1.79 inches. The distance B of the cylinder, from the other end 15 of the tube to the radiussed distal end 14a of the slot, is 1.475 inches. The slot length A, as described above, is 0.315 inches. The width W of the slot is 0.031 inches. Advantageously, 0.030 inches of the entry edges 14b of the slot are beveled to a 45° angle to facilitate the insertion of the lead 23 into slot 14.

The above dimensions of the cylinder 12 are selected to protect a type 3AG fuse device. Thus, the distance B is matched to the body length of the 3AG fuse. The width W of the slot is selected according to the width of the leads of the fuse, such that the width will allow for ease of slideability through the slot, but still provide a secure fit for the lead when the lead is engaged in the pocket 14a of the slot. The overall length of the tube 12 is thus dictated by the size of the fuse to be protected, and the slot lengths required to be in compliance with Underwriters Lab (UL) safety requirements. It should be understood that the present invention is not limited to the above dimensions, but is meant to encompass any design dimensions required to satisfy the characteristics of different fuses while still complying with a given safety standard.

Figure 4:
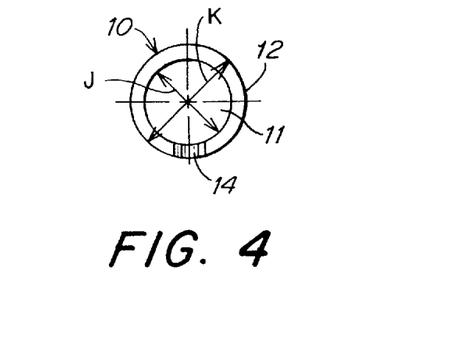
FIG. 4 is a cross section of the protection device of FIG. 3, taken along the X axis.

Referring now to FIG. 4, a radial cross section of the cylindrical tube 12 is viewed along the X-axis, to illustrate the thickness characteristics of the cylinder 12. In this preferred embodiment, the cylindrical tube 12 is fabricated from a polycarbonate plastic. The internal diameter J of the tube is 0.290 inches, and the external diameter K of the tube is 0.375 +/−0.015 inches. Thus, the overall thickness of the tube is 0.085 +/−0.015 inches. The thickness of the tube is dictated by the fire rating of the material. In this preferred embodiment, a thickness of 0.085 +/−0.015 inches is sufficient to ensure that the polycarbonate tube complies with the fire rating requirements of Underwriters Laboratory.

The internal diameter of the tube may be selected to allow for ease of passage of the fuse through the protection device.

Thus, a minimum internal diameter is selected largely as a function of the diameter of the fuse body that is being protected. A maximum internal diameter is a matter of design choice. However, it should be noted that a larger internal diameter will provide a larger protection device that may potentially utilize valuable circuit board area (real estate). In addition, the maximum internal diameter should not be so large as to allow the protection device to fail the finger probe UL requirements.

The external diameter is selected as a function of the internal diameter, and the fire rating of the material. For example, the external diameter in this example is derived from an internal diameter of 0.290 inches, and a desired thickness of 0.085 +/−0.015 (required for the polycarbonate plastic to comply with fire ratings). However, if other materials were used for the tubing, for example a blend of polycarbonate and A.B.S. plastic, which has a higher fire rating, the external diameter may need to be extended to a range of 0.5–0.75 inches to provide a sufficient thickness to satisfy its fire rating.

According to another aspect of the invention, the polycarbonate material from which the cylindrical tube 12 is fabricated is advantageously transparent. Providing a transparent protective device allows for easy viewing of the fuse inside the cylinder to determine the state of the fuse. The tube may be either entirely transparent or alternatively may simply include a transparent viewing area. It should be noted that the transparency of the tube is not a requirement of the invention, should it be determined that such a function is not required of the protective device.

Figure 5:
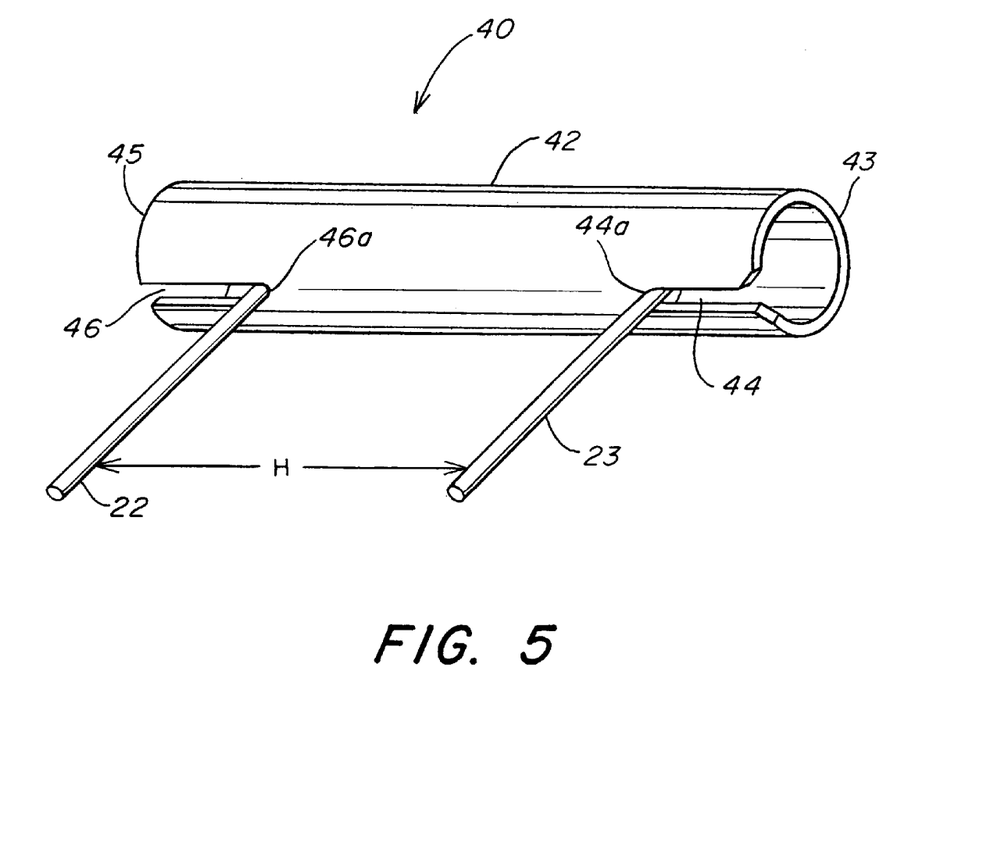
FIG. 5 is a top perspective view of a second embodiment of a protection device according to the present invention.

Referring now to FIG. 5, a second embodiment of a protection device 40 is shown to include a cylindrical tube 42 having a first slot 44 at one end 43 (similar to the first embodiment 10), and further a second slot 46 at the other end 45. In FIG. 5, a fuse 20 is again the protected device. The introduction of a second slot 46 provides protection against contact of both leads 22, 23 of the fuse. A length H between the internal pockets 44a and 46a of the slots 44 and 46 respectively is selected to correlate to the length of the fuse body being protected. The respective slot pockets thus form a gauge for ensuring that the leads are bent at the correct positions to provide a tight fit between the fuse and the board. The A slot lengths (of both slots 44 and 46) are selected to ensure that the protection device satisfies the finger probe safety requirements set forth by Underwriters Laboratory.

Thus, an inexpensive and reliable fuse protection device for protecting against hazardous contact has been provided. The cylindrical tube length and slot lengths can be selected to provide a built-in, lead-forming gauge, thereby ensuring a tight fit with the board. The overall size of the protection circuit need only be minimally larger than the fuse itself, and thus reduces the amount of additional circuit board real estate required for protection as compared to prior art devices. In addition, the device is advantageously transparent to allow for ease of identification and replacement of out-of-service fuses.

The described fuse protection device, in addition to the above cited advantages, further allows for systems to be provided where the circuit boards may be inserted and removed without the use of special tools, because the hazardous areas of the circuit board are isolated from the user. Thus it should be understood that, although the above description has proceeded with regard to the protection of hazardous areas involving fuses, it is envisioned that it could be further extended to isolate potentially hazardous connections of any such components, including, for example, resistor devices and the like. In addition, although a cylindrical tube has been described, it is further envisioned that other shapes of protection devices, such as rectangles, ovals, or the like, may similarly be substituted in compliance with the above described fire rating and finger probe requirements. It may be made from a variety of electrically insulating materials. Also, the enclosure may be a solid enclosure, with no openings other than at the ends, or it may have other slots or openings as desired in a particular application.

Having thus described numerous embodiments of the invention, it will be apparent to one of skill in the art that other embodiments incorporating the same may be used. Therefore, this invention should not be limited to the disclosed embodiments, but rather should be limited only by the scope of the appended claims.

We claim:

1. An apparatus for isolating a hazardous connection formed when a component, having a body and a lead, is connected to a circuit board, the apparatus comprising:

an elongated enclosure having two opposing ends and a length defined between the ends, a bore extending the length of the enclosure, and a slot extending though the enclosure to the bore, the slot extending along the length from a first end of the enclosure to a distal slot end to form a slotted length portion of the enclosure, the remainder of the enclosure forming a fully enclosed remaining length portion, wherein the bore is provided to receive a component body and the slot is provided to receive a component lead, and the slotted length portion forms a shield for isolating a hazardous connection when the lead is connected to a circuit board.

2. The apparatus of claim 1, wherein the remaining length portion corresponds to a length of the component body.

3. The apparatus of claim 2, wherein a length of the slotted length portion is selected to prevent a finger from contacting the hazardous connection.

4. The apparatus of claim 1, wherein the enclosure is fabricated from a material having a thickness provided to comply with a fire rating of the material.

5. The apparatus of claim 1, wherein the slot has a width selected to receive a lead of a given width.

6. The apparatus of claim 1, wherein the slot has beveled edges adjacent the first end of the enclosure to facilitate insertion of the lead into the slot.

7. The apparatus of claim 1, wherein the enclosure is made from polycarbonate material.

8. The apparatus of claim 1, wherein the enclosure is made at least in part from a transparent material.

9. The apparatus of claim 1, wherein the enclosure is a cylindrical tube.

10. The apparatus of claim 1, wherein the enclosure is a rectangular sleeve.

11. The apparatus of claim 1, wherein the component is a fuse.

12. The apparatus of claim 1, wherein the component is a resistor.

13. An apparatus for isolating a connection between a fuse and a power supply, the fuse including a first lead for coupling to the power supply and a second lead for coupling to a component requiring protection, comprising:

an elongated enclosure having an opening therethrough for accepting said fuse, and a first slot extending from a first end of said enclosure longitudinally through a surface of said enclosure to a slot end pocket, said enclosure further comprising an fully closed remaining portion extending from the slot end pocket to the second end of the enclosure, wherein said first lead of said fuse is positioned orthogonally to said enclosure to allow engagement of the first lead with the slot pocket when the fuse is positioned within the enclosure.

14. The apparatus of claim 13, wherein said second lead is bent orthogonally to said enclosure, in parallel with said first lead.

15. The apparatus of claim 14, wherein a distance between said slot end pocket and a second end of the enclosure is matched to a distance between connections of said fuse on said circuit board.

16. The apparatus of claim 15, wherein said distance is further matched to a length of said fuse.

17. The apparatus of claim 13, wherein a predetermined portion of said protection device extends past said first lead when said first lead is engaged with said slot end pocket.

18. The apparatus of claim 17, wherein a length of said predetermined portion is selected to prevent finger contact with said first lead.

19. The apparatus of claim 13, wherein said enclosure further comprises a second slot extending from a second end of said enclosure longitudinally through said surface of said enclosure to a second slot end pocket and aligned with said first slot.

20. The apparatus as recited in claim 19, wherein said second lead is bent orthogonally to said enclosure, in parallel with said first lead.

21. An apparatus for isolating a connection between a first device and a device requiring protection, the apparatus including a component having a first lead for coupling to the first device and a second lead for coupling to the device requiring protection, the apparatus further comprising:

a protection device having an opening therethrough for accepting said component, and a first slot extending from a first end of said protection device longitudinally through a surface of said protection device to a first slot end pocket, wherein said first lead of said component is positioned orthogonally to said protection device such that the component engages said first slot end pocket when the component is inserted in the protection device, and wherein said protection device further comprises a second slot extending from a second end of said protection device longitudinally through said surface of said protection device in line with said first slot to a second slot, and wherein the enclosure further comprises a fully closed portion between said first slot and said second slot, wherein said second lead of said component is positioned orthogonally to said protection device to engage the second slot end pocket when said component is inserted in the protection device.

22. A method of isolating a hazardous connection comprising the steps of:

providing a protection device having an opening extending therethrough, and a slot extending longitudinally from one end of the protection device for a predetermined distance along the device, wherein the predetermined distance is less than a length of the protection device, and wherein the protection device further comprises a fully closed portion extending from a pocket of the slot to a second end of the protection device;

advancing a component through said opening of said protection device until a lead of said component, positioned orthogonally to said protection device, engages a pocket of said slot such that a portion of said protection device extends beyond said lead for isolating a hazardous connection between the lead and another device.

23. A method of isolating a hazardous connection on a circuit board comprising the steps of:

providing a protection device having an opening extending therethrough, and a slot extending longitudinally from one end of the protection device for a predetermined distance along the device wherein the predetermined distance is less than a length of the protection device, and wherein the protection device further comprises a fully closed portion extending from a pocket of the slot to a second end of the protection device:

advancing a component having a first lead coupled to a first end through said opening of said protection device until said first lead of said component is positioned orthogonally to said protection device and engages a pocket of said slot;

wherein said component further comprises a second lead coupled to a second end, and wherein said second lead extends from said protection device when said first lead is secured in said pocket of said slot; and bending said second lead of said component to a position parallely aligned with said first lead.

* * * * *